US011705424B2

(12) United States Patent
Fujita et al.

(10) Patent No.: US 11,705,424 B2
(45) Date of Patent: Jul. 18, 2023

(54) SPRING ELECTRODE FOR PRESS-PACK POWER SEMICONDUCTOR MODULE

(71) Applicant: Mitsubishi Electric Corporation, Tokyo (JP)

(72) Inventors: Shigeto Fujita, Tokyo (JP); Tetsuya Matsuda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 420 days.

(21) Appl. No.: 16/629,658

(22) PCT Filed: Aug. 31, 2017

(86) PCT No.: PCT/JP2017/031365
§ 371 (c)(1),
(2) Date: Jan. 9, 2020

(87) PCT Pub. No.: WO2019/043870
PCT Pub. Date: Mar. 7, 2019

(65) Prior Publication Data
US 2020/0152595 A1 May 14, 2020

(51) Int. Cl.
*H01L 23/00* (2006.01)

(52) U.S. Cl.
CPC .................. *H01L 24/72* (2013.01)

(58) Field of Classification Search
CPC ......... H01L 23/62; H01L 23/48; H01L 24/72; H01L 21/52; H01L 25/072;
(Continued)

(56) References Cited

U.S. PATENT DOCUMENTS 2,927,953 A * 3/1960 Staller ................ H01L 23/3672
174/12 R
3,270,697 A * 9/1966 Solum ................ E21B 17/1028
228/151
(Continued)

FOREIGN PATENT DOCUMENTS

DE 28 55 493 A1 7/1980
DE 29 37 049 A1 4/1981
(Continued)

OTHER PUBLICATIONS

International Search Report issued in PCT/JP2017/031365; dated Nov. 7, 2017.
(Continued)

*Primary Examiner* — Alexander O Williams
(74) *Attorney, Agent, or Firm* — Studebaker & Brackett PC

(57) ABSTRACT

A spring electrode for a press-pack power semiconductor module includes a first electrode in contact with a power semiconductor chip, a second electrode arranged to face the first electrode, and a pressure pad which connects the first electrode and the second electrode and has flexibility in a normal direction of opposing surfaces of the first electrode and the second electrode. The opposing surfaces of the first electrode and the second electrode can be polygons of a pentagon or more, the pressure pad can be a cylindrical conductor or a plurality of wire conductors, and sides of the opposing surface of the first electrode and sides of the opposing surface of the second electrode corresponding to these sides are connected in parallel by the pressure pad.

20 Claims, 8 Drawing Sheets

(58) Field of Classification Search
CPC . H01L 2924/19107; H01L 2924/13055; H01L 2224/06181; H01L 221/52; H01L 25/07; H01L 25/00–25/18; H01L 23/03; H01L 25/04; H01L 25/06; H01L 25/08; H01L 25/10; H01L 25/11; H01L 25/12; H01L 25/13; H01L 25/14; H01L 25/15; H01L 25/16; H01R 11/01
USPC .......................................................... 257/689
See application file for complete search history.

(56) References Cited

U.S. PATENT DOCUMENTS

| | | | | |
|---|---|---|---|---|
| 3,412,628 | A | * | 11/1968 | De Gain ................. B60R 19/34 52/843 |
| 3,495,474 | A | * | 2/1970 | Nishimura .............. B60R 19/34 293/133 |
| 3,699,624 | A | * | 10/1972 | De Gain ................. B62D 1/192 29/454 |
| 4,333,102 | A | | 6/1982 | Jester et al. |
| 4,407,006 | A | | 9/1983 | Holick et al. |
| 4,753,617 | A | * | 6/1988 | Jacobs ................. H05K 3/3426 439/825 |
| D315,959 | S | * | 4/1991 | Bilangi ........................ D24/199 |
| 5,510,650 | A | * | 4/1996 | Erskine, Jr. .......... H01L 23/3672 257/E23.105 |
| 6,320,268 | B1 | | 11/2001 | Lang et al. |
| 2004/0207070 | A1 | | 10/2004 | Kaufmann et al. |

FOREIGN PATENT DOCUMENTS

| | | |
|---|---|---|
| JP | 2000223658 A | 8/2000 |
| JP | 2004528724 A | 9/2004 |

OTHER PUBLICATIONS

Office Action issued in JP 2019-538847; mailed by the Japanese Patent Office dated May 26, 2020, which is related to U.S. Appl. No. 16/629,658.

An Office Action mailed by China National Intellectual Property Administration dated Feb. 6, 2023, which corresponds to Chinese Patent Application No. 201780094212.2 and is related to U.S. Appl. No. 16/629,658; with English language translation.

* cited by examiner

SPRING ELECTRODE FOR PRESS-PACK POWER SEMICONDUCTOR MODULE

TECHNICAL FIELD

The present invention relates to a spring electrode for a press-pack power semiconductor module.

BACKGROUND ART

A press-pack power semiconductor module such as a press-pack IGBT (Insulated Gate Bipolar Transistor) module has a plurality of semiconductor chips inside (for example, FIG. 1 of Patent Document 1). The plurality of semiconductor chips are electrically connected by being pressed from the vertical direction. In order to apply pressure uniformly to the plurality of semiconductor chips, each semiconductor chip needs to have a spring structure and play in a conductive path. A pressure pad is responsible for providing this play and ensuring the electrical connection.

In order to increase the current carrying capacity with respect to the normal current, a plurality of pressure pads may be used for one semiconductor chip. In addition, since a spring between the pressure pads functions as an inductance even if it has electrical conductivity, it has a high impedance, particularly with respect to high frequencies, and no current flows.

PRIOR ART DOCUMENT

Patent Document

Patent Document 1: Japanese Unexamined Patent Application Publication (Translation of PCT Application) No. 2004-528724

SUMMARY

Problem to be Solved by the Invention

There is a concern that the press-pack semiconductor module is broken when the semiconductor chip is short-circuited. In other words, when the semiconductor chip is short-circuited and the conductive path inside the module is disconnected so that an arc is generated in the disconnected portion, the atmosphere inside the module expands due to heating by the arc or the solid vaporizes, leading to a failure of the module.

The principle that the conductive path in the module is disconnected when the semiconductor chip is short-circuited is as follows. When the semiconductor chip is short-circuited, short-circuit currents flow through the pressure pads. Since the short-circuit current is a large current, the pressure pads are melted by Joule heat generation due to the short-circuit current, the conductive path is disconnected, and an arc is generated. In particular, since the short-circuit current is a high frequency, there is a concern that it concentrates on the edge portion of the pressure pads due to the skin effect, and in particular, this portion becomes hot and melting starts. Further, since the short-circuit currents flowing through the two pressure pads are in the same direction, an electromagnetic attractive force is generated between them, and the pressure pads are broken. Thereby, it is conceivable that an arc is generated due to the disconnection of the conductive path, resulting in a failure of the module.

Therefore, it is necessary to apply a robust structure to the press-pack power semiconductor module, which has been an impediment to downsizing or cost reduction.

The present invention has been made in view of the above-described problems, and an object thereof is to provide a spring electrode for preventing disconnection of a conductive path when a semiconductor chip is short-circuited in a press-pack power semiconductor module.

Means to Solve the Problem

A first spring electrode for a press-pack power semiconductor module of the present invention includes: a first electrode in contact with a power semiconductor chip; a second electrode arranged to face the first electrode; and a pressure pad which connects the first electrode and the second electrode and has flexibility in a normal direction of opposing surfaces of the first electrode and the second electrode, in which the opposing surfaces of the first electrode and the second electrode are polygons of a pentagon or more, and in which sides of the opposing surface of the first electrode and sides of the opposing surface of the second electrode corresponding to these sides are connected in parallel by the pressure pad.

A second spring electrode for a press-pack power semiconductor module of the present invention includes: a first electrode in contact with a power semiconductor chip; a second electrode arranged to face the first electrode; and a pressure pad which connects the first electrode and the second electrode and has flexibility in a normal direction of opposing surfaces of the first electrode and the second electrode, in which the pressure pad is a cylindrical conductor having a cylindrical axis in the normal direction of the opposing surfaces of the first electrode and the second electrode, and in which the cylindrical conductor includes a plurality of slits extending from a side of the first electrode side to a side of the second electrode side except for both ends thereof.

A third spring electrode for a press-pack power semiconductor module of the present invention includes: a first electrode in contact with a power semiconductor chip; a second electrode arranged to face the first electrode; and a pressure pad which connects the first electrode and the second electrode and has flexibility in a normal direction of opposing surfaces of the first electrode and the second electrode, in which the pressure pad is a plurality of wire conductors arranged along side surfaces of a virtual cylinder having the first electrode and the second electrode as both end surfaces.

Effects of the Invention

A first spring electrode for a press-pack power semiconductor module of the present invention includes: a first electrode in contact with a power semiconductor chip; a second electrode arranged to face the first electrode; and a pressure pad which connects the first electrode and the second electrode and has flexibility in a normal direction of opposing surfaces of the first electrode and the second electrode, in which the opposing surfaces of the first electrode and the second electrode are polygons of a pentagon or more, and in which sides of the opposing surface of the first electrode and sides of the opposing surface of the second electrode corresponding to these sides are connected in parallel by the pressure pad. Therefore, since the short-circuit current generated when the power semiconductor chip is short-circuited flows while being branched into the plurality of pressure pads, the short-circuit current flowing through one pressure pad is reduced. As a result, heat generation in the pressure pads and an electromagnetic attractive force between the pressure pads are suppressed, and disconnection of the pressure pads, that is, the conductive path can be prevented.

A second spring electrode for a press-pack power semiconductor module of the present invention includes: a first electrode in contact with a power semiconductor chip; a second electrode arranged to face the first electrode; and a pressure pad which connects the first electrode and the second electrode and has flexibility in a normal direction of opposing surfaces of the first electrode and the second electrode, in which the pressure pad is a cylindrical conductor having a cylindrical axis in the normal direction of the opposing surfaces of the first electrode and the second electrode, and in which the cylindrical conductor includes a plurality of slits extending from a side of the first electrode to a side of the second electrode except for both ends thereof. Therefore, since the short-circuit current generated when the power semiconductor chip is short-circuited flows while being branched into the divided regions of the cylindrical conductor which are divided by the slits, the short-circuit current flowing through one divided region is reduced. As a result, heat generation in the divided regions and an electromagnetic attractive force between the divided regions are suppressed, and disconnection of the divided regions, that is, the conductive path can be prevented.

A third spring electrode for a press-pack power semiconductor module of the present invention includes: a first electrode in contact with a power semiconductor chip; a second electrode arranged to face the first electrode; and a pressure pad which connects the first electrode and the second electrode and has flexibility in a normal direction of opposing surfaces of the first electrode and the second electrode, in which the pressure pad is a plurality of wire conductors arranged along side surfaces of a virtual cylinder having the first electrode and the second electrode as both end surfaces. Therefore, since the short-circuit current generated when the power semiconductor chip is short-circuited flows while being branched into the plurality of wire conductors, the short-circuit current flowing through one wire conductor is reduced. As a result, heat generation in the wire conductors and an electromagnetic attractive force between the wire conductors are suppressed, and disconnection of the wire conductors, that is, the conductive path can be prevented.

Objects, features, aspects, and advantages of the present invention will become more apparent from the following detailed description and the accompanying drawings.

DESCRIPTION OF EMBODIMENTS

<Prerequisite Technology>

Figure 1:
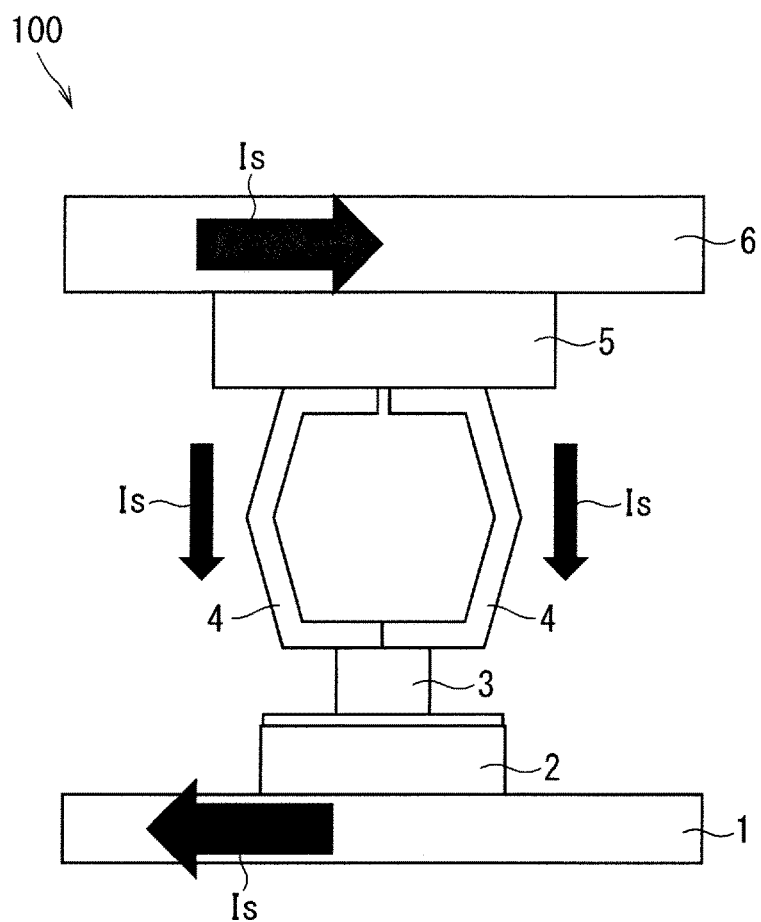
FIG. 1 is a diagram for explaining a short-circuit current.

FIG. 1 is a configuration diagram of a press-pack semiconductor module 100 as a prerequisite technology. A press-pack semiconductor module 100 includes a base plate 1, a power semiconductor chip 2, a lower electrode 3, pressure pads 4, an upper electrode 5, and a cover plate 6. The power semiconductor chip 2 such as an IGBT chip is bonded to the upper surface of the base plate 1. The lower electrode 3 is bonded to the upper surface of the power semiconductor chip 2. The two pressure pads 4 are connected in parallel between the upper surface of the lower electrode 3 and the lower surface of the upper electrode 5. The upper surface of the upper electrode 5 is bonded to the cover plate 6. In FIG. 1, only the configuration related to one power semiconductor chip 2 is illustrated, but actually, a plurality of power semiconductor chips 2 are arranged on the base plate 1.

When the power semiconductor chip 2 is short-circuited, a short-circuit current Is flows through the pressure pads 4. Since the short-circuit current is a large current, the pressure pads 4 are melted by Joule heat generation due to the short-circuit currents, the conductive path is disconnected, and an arc is generated. In particular, since the short-circuit current is a high frequency, there is a concern that it concentrates on the edge portion of the pressure pads 4 due to the skin effect, and in particular, this portion becomes hot and melting starts. Further, since the short-circuit currents flowing through the two pressure pads 4 are in the same direction, an electromagnetic attractive force is generated between them, and the pressure pads 4 are broken. Thereby, it is conceivable that an arc is generated due to the disconnection of the conductive path, resulting in a failure of the module.

First Embodiment

Figure 2:
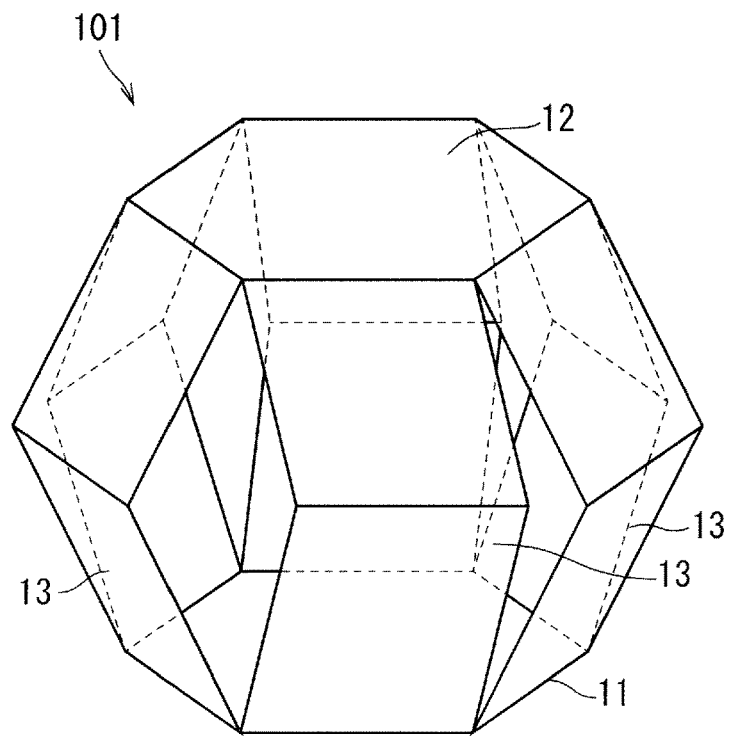
FIG. 2 is a diagram showing a configuration of a spring electrode of a first embodiment.

FIG. 2 is a configuration diagram of a spring electrode 101 according to a first embodiment. The spring electrode 101 is a spring electrode for a press-pack power semiconductor module, and includes a lower electrode 11, an upper electrode 12, and pressure pads 13. The lower electrode 11 and the upper electrode 12 are arranged to face each other with the pressure pads 13 interposed therebetween. Both the lower electrode 11 and the upper electrode 12 have a regular hexagonal plate shape. That is, the surfaces of the lower electrode 11 and the upper electrode 12 which face each other (hereinafter referred to as "opposing surfaces") are regular hexagons and have six sides. The six sides of the lower electrode 11 and the six sides of the upper electrode 12 corresponding to these six sides are connected by six pressure pads 13.

The pressure pads 13 have flexibility in the normal direction of the opposing surfaces of the lower electrode 11 and the upper electrode 12. Therefore, the distance between the lower electrode 11 and the upper electrode 12 decreases as the pressure pads 13 bend.

Although not shown in FIG. 2, a power semiconductor chip is bonded to the lower surface of the lower electrode 11 or the upper surface of the upper electrode 12. That is, when the power semiconductor chip is bonded to the upper electrode 12, the upper electrode 12 functions as a first electrode in contact with the power semiconductor chip, and the lower electrode 11 functions as a second electrode arranged to face the first electrode. When the power semiconductor chip is bonded to the lower electrode 11, the lower electrode 11 functions as the first electrode, and the upper electrode 12 functions as the second electrode.

The short-circuit current generated when the power semiconductor chip is short-circuited flows between the lower electrode 11 and the upper electrode 12 while being divided into the six pressure pads 13. Therefore, the short-circuit current flowing through one pressure pad 13 becomes smaller correspondingly to the number of pressure pads 13. Therefore, the heat generation of each pressure pad 13 is suppressed, and the electromagnetic attractive force generated between the pressure pads 13 is reduced.

In FIG. 2, the lower electrode 11 and the upper electrode 12 are shown as regular hexagonal plate shapes, but it is only necessary that the opposing surfaces of these electrodes be polygons of a pentagon or more. Whatever the kind of the polygonal shape of a pentagon or more that the opposing surfaces of the lower electrode 11 and the upper electrode 12 may have, the pressure pads 13 connect sides of the opposing surface in the lower electrode 11 and corresponding sides of the opposing surface in the upper electrode 12. In such a configuration, the short-circuit current flows between the lower electrode 11 and the upper electrode 12 while being branched into at least five pressure pads 13. Therefore, the short-circuit current flowing through one pressure pad 13 becomes smaller correspondingly to the number of pressure pads 13. The effect of reducing the short-circuit current increases as the number of polygonal corners of the lower electrode 11 and the upper electrode 12 increases and the number of pressure pads 13 increases accordingly.

Even if the opposing surfaces of the lower electrode 11 and the upper electrode 12 are not regular polygons, the above-described effect of reducing the short-circuit current can be obtained. However, in the case of the regular polygon, the pressure pads 13 are arranged at the same size and at equal intervals. Accordingly, the short-circuit currents flowing through the pressure pads 13 are equalized, and it is possible to prevent the heat or the electromagnetic attractive force from being biased at the pressure pads 13.

<Effect of First Embodiment>

The spring electrode 101 for a press-pack power semiconductor module of the first embodiment of the present invention includes: the lower electrode 11 or the upper electrode 12 which is the first electrode in contact with a power semiconductor chip; the lower electrode 11 or the upper electrode 12 which is the second electrode arranged to face the first electrode; and the pressure pad 13 which connects the first electrode and the second electrode and has flexibility in a normal direction of opposing surfaces of the first electrode and the second electrode, in which the opposing surfaces of the first electrode and the second electrode are the same polygon of a pentagon or more, and in which sides of the opposing surface of the first electrode and sides of the opposing surface of the second electrode corresponding to these sides are connected in parallel by the pressure pad 13. With such a configuration, the short-circuit current generated when the power semiconductor chip is short-circuited flows between the lower electrode 11 and the upper electrode 12 while being branched into at least five pressure pads 13, so that the short-circuit current flowing through one pressure pad 13 is reduced. Therefore, heat generated in each pressure pad 13 and an electromagnetic attractive force generated between the pressure pads 13 are reduced, and disconnection of each pressure pad 13 is suppressed. Therefore, even when the power semiconductor chip is short-circuited, an arc due to the disconnection of the pressure pads 13 does not occur, and the thermal expansion of the atmosphere due to the arc does not occur, so that the failure of the press-pack semiconductor module can be suppressed. Therefore, it is not necessary to employ a robust structure for the press-pack semiconductor module in order to withstand the thermal expansion of the atmosphere due to the arc, and the press-pack semiconductor module can be reduced in size and cost.

Further, in the spring electrode 101, the opposing surfaces of the first electrode and the second electrode are regular polygons, so that the pressure pads 13 are arranged at the same size and at equal intervals. Accordingly, the short-circuit currents flowing through the pressure pads 13 are equalized, and it is possible to prevent the heat or the electromagnetic attractive force from being biased at the pressure pads 13.

Second Embodiment

Figure 3:
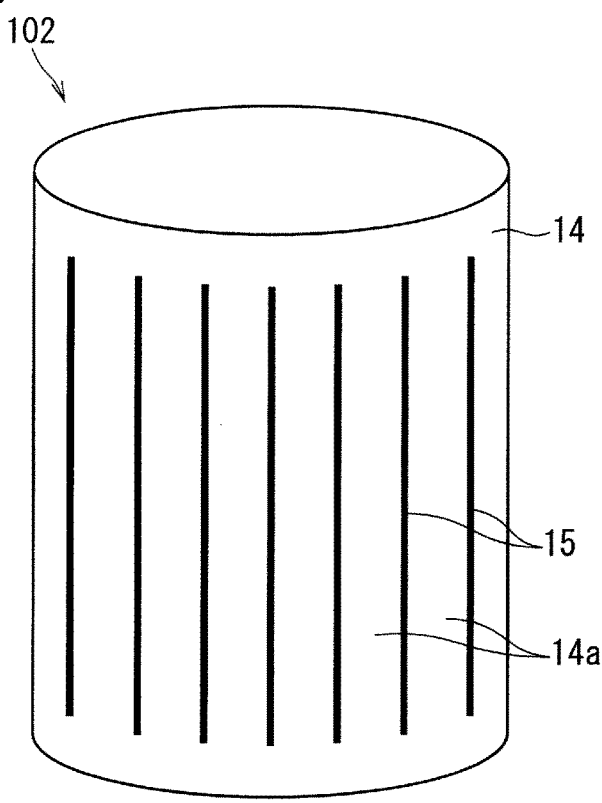
FIG. 3 is a diagram showing a configuration of a spring electrode of a second embodiment.

FIG. 3 is a configuration diagram of a spring electrode 102 according to a second embodiment. The spring electrode 102 is a spring electrode for a press-pack power semiconductor module, and includes a cylindrical conductor 14 having slits 15. Although not shown in FIG. 3, the upper end of the cylindrical conductor 14 is in contact with an upper electrode, and the lower end is in contact with a lower electrode.

The upper electrode and the lower electrode are arranged to face each other with the cylindrical conductor 14 interposed therebetween and are connected by the cylindrical conductor 14. The cylindrical conductor 14 has a cylindrical axis in the normal direction of the opposing surfaces of the upper electrode and the lower electrode, and connects the upper electrode and the lower electrode.

A power semiconductor chip is bonded to either the upper electrode or the lower electrode. That is, when the power semiconductor chip is bonded to the upper electrode, the upper electrode functions as a first electrode in contact with the power semiconductor chip, and the lower electrode functions as a second electrode arranged to face the first electrode. When the power semiconductor chip is bonded to the lower electrode, the lower electrode functions as the first electrode, and the upper electrode functions as the second electrode.

The slits 15 are formed from the upper end side to the lower end side except for the upper end and the lower end of the cylindrical conductor 14. The slits 15 are parallel to the cylindrical axis direction of the cylindrical conductor 14. Further, the cylindrical conductor 14 is thin enough to be flexible with respect to the pressure contact in the cylindrical axial direction, and functions as a pressure pad in the press-pack semiconductor module.

The surface of the cylindrical conductor 14 is divided into a plurality of divided regions 14a by slits 15. The short-circuit current generated when the power semiconductor chip is short-circuited branches into the divided regions 14a and flows between the upper electrode and the lower electrode. Here, the short-circuit current flowing through one divided region 14a becomes smaller correspondingly to the number of divided regions 14a, that is, the number of slits 15. Therefore, heat generation in the divided regions 14a is suppressed, and the electromagnetic attractive force generated between the divided regions 14a is reduced.

Since each divided region 14a is arranged concentrically around the cylindrical axis of the cylindrical conductor 14, if the slits 15 are arranged at equal intervals in the circumferential direction of the cylindrical conductor 14, the arrangement of the divided regions 14a becomes uniform. Therefore, the short-circuit currents flowing through the divided regions 14a are equalized, and it is possible to prevent the heat or the electromagnetic attractive force from being biased at the divided regions 14a.

<Modification of Second Embodiment>

Figure 4:
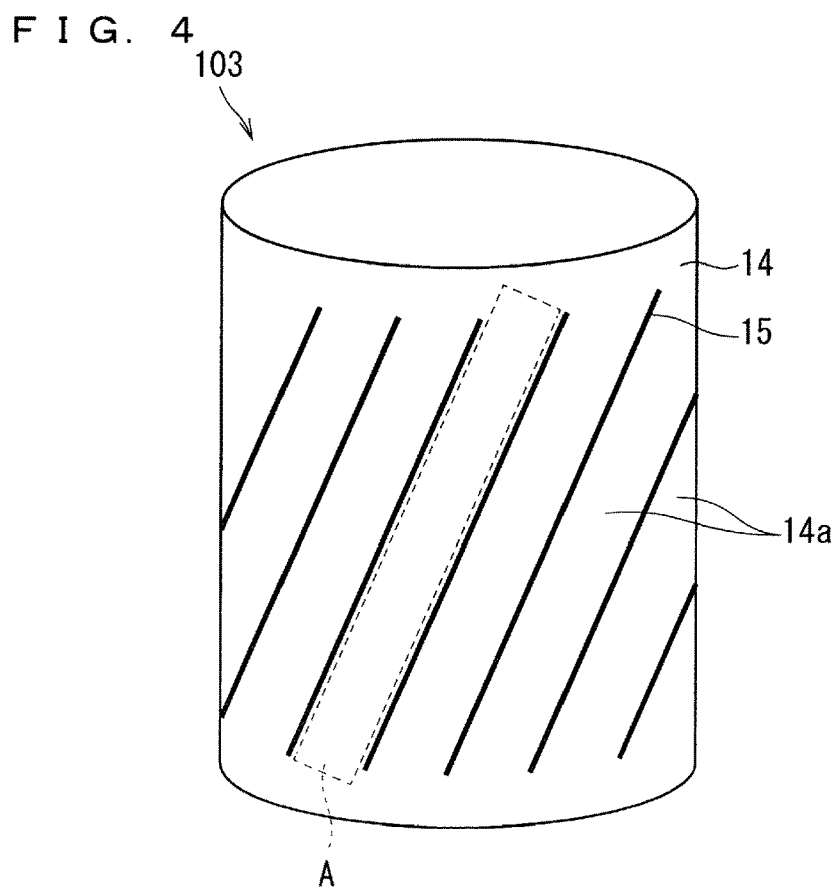
FIG. 4 is a diagram showing a configuration of a spring electrode of a modification of the second embodiment.
Figure 5:
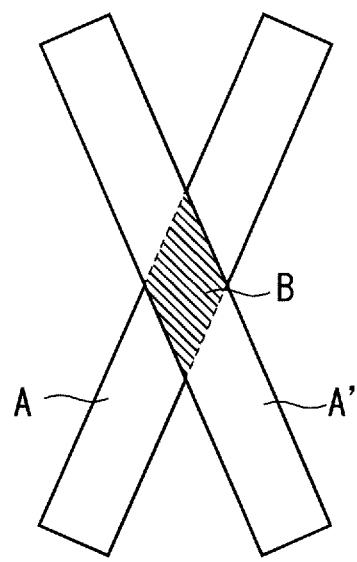
FIG. 5 is an enlarged diagram of a main part of the spring electrode according to the modification of the second embodiment.

In the spring electrode 102, the slits 15 are provided in the cylindrical axis direction, that is, in the vertical direction in FIG. 3. However, like a spring electrode 103 shown in FIG. 4, the slits 15 may be formed obliquely with respect to the axial direction of the cylinder. According to such a configuration, the facing area between the front divided region 14a and the rear divided region 14a located at a position symmetrical to the divided region 14a with respect to the cylindrical axis is reduced. For example, as shown in FIG. 5, the divided region 14a corresponding to the region A in FIG. 4 and the region A' that is the divided region 14a located at a position symmetrical to the region A with respect to the cylindrical axis face each other only in the region B. Therefore, when the short-circuit current flows in the region A and the region A', the electromagnetic attractive force acting between the two regions is reduced, so that the inward contraction of the spring electrode 103 can be suppressed.

<Effect of Second Embodiment>

The spring electrode 102, 103 for a press-pack power semiconductor module of the second embodiment includes: the upper electrode or the lower electrode which is the first electrode in contact with a power semiconductor chip; the upper electrode or the lower electrode which is the second electrode arranged to face the first electrode; and the pressure pad which connects the first electrode and the second electrode and has flexibility in a normal direction of opposing surfaces of the first electrode and the second electrode. The pressure pad is the cylindrical conductor 14 having a cylindrical axis in the normal direction of the opposing surfaces of the first electrode and the second electrode, and the cylindrical conductor 14 is formed with a plurality of slits 15 extending from the side of the first electrode to the side of the second electrode except for both ends thereof. Therefore, the short-circuit current generated when the power semiconductor chip is short-circuited flows between the upper electrode and the lower electrode while being branched into the plurality of divided regions 14a of the cylindrical conductor 14 divided by the slits 15. As a result, the short-circuit current flowing through one divided region 14a is reduced, so that heat generation in the divided regions 14a and the electromagnetic attractive force between the divided regions 14a can be suppressed. Therefore, disconnection of the divided regions 14a, that is, the conductive path can be prevented, and breakage of the semiconductor module can be suppressed.

Further, when the plurality of slits 15 are formed at equal intervals in the circumferential direction of the cylindrical conductor 14, the arrangement of the divided regions 14a becomes uniform, so that the short circuit currents flowing through the divided regions 14a are equalized. Therefore, it is possible to prevent the heat or the electromagnetic attractive force from being biased at the divided regions 14a.

Further, when the plurality of slits 15 are formed obliquely with respect to the cylindrical axis direction of the cylindrical conductor 14, the facing area of the divided region 14a becomes smaller on the front side and the rear side of the cylindrical conductor 14. Accordingly, the electromagnetic attractive force acting between the two regions when the short-circuit current is generated is reduced, and the contraction of the spring electrode 103 to the inside is suppressed.

Third Embodiment

Figure 6:
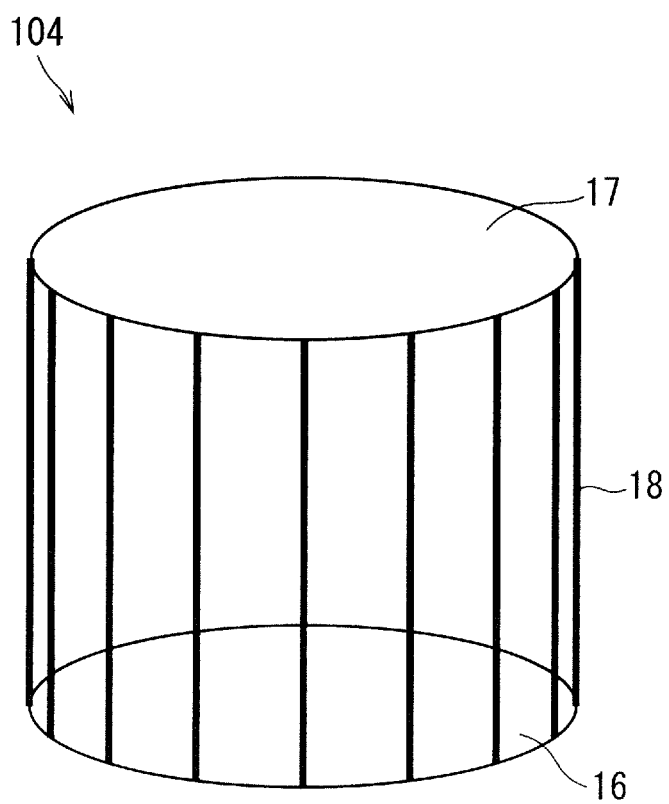
FIG. 6 is a diagram showing a configuration of a spring electrode of a third embodiment.

FIG. 6 is a configuration diagram of a spring electrode 104 according to a third embodiment. The spring electrode 104 is a spring electrode for a press-pack power semiconductor module, and includes a lower electrode 16, an upper electrode 17, and a plurality of wire conductors 18.

The lower electrode 16 and the upper electrode 17 are circular discs, and the wire conductors 18 connect the outer peripheries of the lower electrode 16 and the upper electrode 17. In other words, the wire conductor 18 is arranged along the side surface of the virtual cylinder having the lower electrode 16 and the upper electrode 17 as both end surfaces.

Since the wire conductors 18 have elasticity, the spring electrode 104 has flexibility in the vertical direction of FIG. 6, that is, in the normal direction of the opposing surfaces of the lower electrode 16 and the upper electrode 17. That is, the wire conductors 18 function as pressure pads in a press-pack semiconductor module.

Although not shown in FIG. 6, a power semiconductor chip is bonded to the lower surface of the lower electrode 16 or the upper surface of the upper electrode 17. That is, when the power semiconductor chip is bonded to the upper electrode 17, the upper electrode 17 functions as a first electrode in contact with the power semiconductor chip, and the lower electrode 16 functions as a second electrode arranged to face the first electrode. When the power semiconductor chip is bonded to the lower electrode 16, the lower electrode 16 functions as the first electrode, and the upper electrode 17 functions as the second electrode.

The short-circuit current generated when the power semiconductor chip is short-circuited flows between the lower electrode 16 and the upper electrode 17 while being branched into the plurality of wire conductors 18. For this reason, the short-circuit current flowing through one wire conductor 18 is reduced correspondingly to the number of wire conductors 18. Therefore, heat generation in the wire conductors 18 is suppressed, and the electromagnetic attractive force generated between the wire conductors 18 is reduced.

The diameter of the wire conductor 18 is 2 mm or more, for example. The frequency of the short-circuit current waveform is assumed to be 5 kHz at maximum. Since the skin depth in the case of 5 kHz is 0.92 mm, an effective energization region for a short-circuit current can be secured by setting the diameter of the wire conductor 18 to 2 mm or more.

Further, it is desirable that the number of wire conductors 18 is eight or more, and these are arranged symmetrically with respect to the axis connecting the centers of the lower electrode 16 and the upper electrode 17. The maximum short-circuit current is assumed to be 1 MA. When the material of the wire conductors 18 is copper, the diameter is 2 mm, and the number is eight, the temperature of the wire conductors 18 does not reach 1085° C., which is the melting temperature of copper, even when a current of 1 MA is applied to the spring electrode 104. Further, by arranging the wire conductors 18 symmetrically as described above, the current flowing through each wire conductor 18 becomes uniform, so that it is possible to avoid the current from being concentrated on some of the wire conductors 18 and becoming hot.

<Modification of Third Embodiment>

Figure 7:
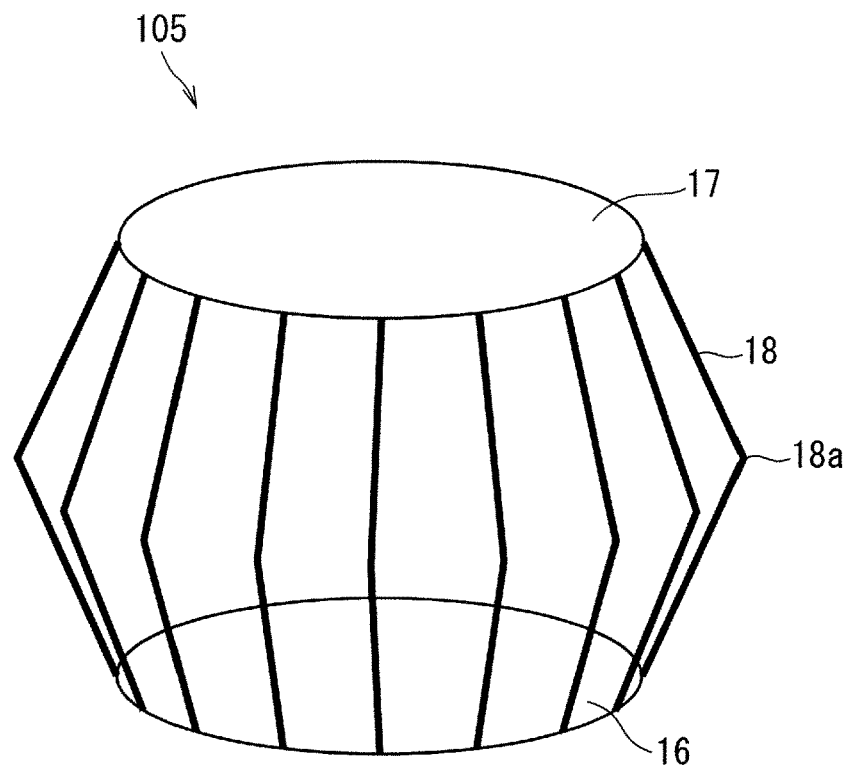
FIG. 7 is a diagram showing a configuration of a spring electrode of a modification of the third embodiment.
Figure 8:
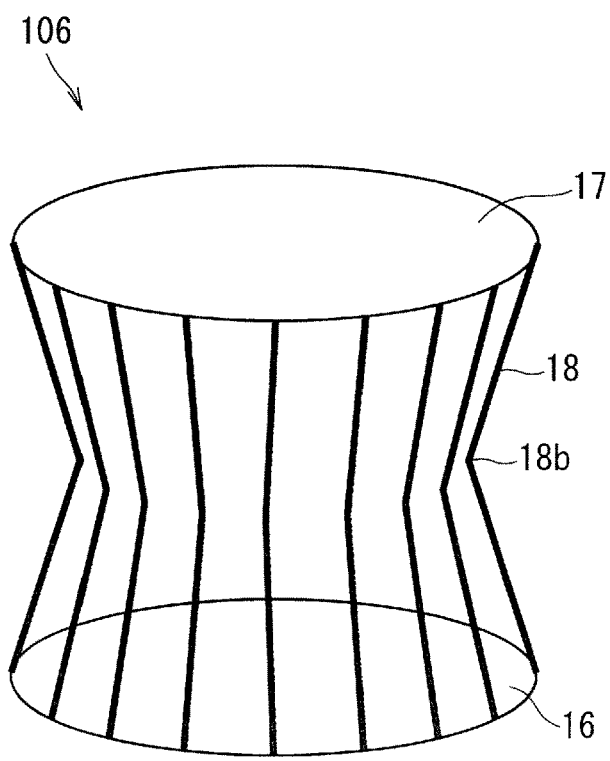
FIG. 8 is a diagram showing a configuration of a spring electrode of a modification of the third embodiment.

As shown in FIG. 6, the wire conductor 18 does not have a bending portion in the spring electrode 104. However, like a spring electrode 105 shown in FIG. 7, the wire conductors 18 may include a bending portion 18a protruding outward from the outer periphery of the lower electrode 16 or the upper electrode 17, or like a spring electrode 106 shown in FIG. 8, the wire conductors 18 may include a bending portion 18b protruding inward from the outer periphery of the lower electrode 16 or the upper electrode 17. This increases the flexibility of the spring electrode in the vertical direction.

Figure 9:
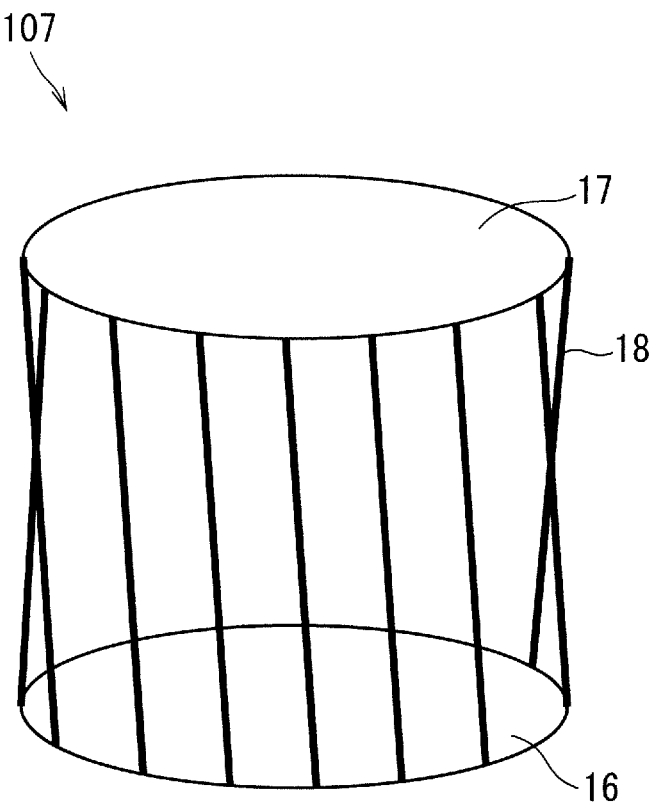
FIG. 9 is a diagram showing a configuration of a spring electrode of a modification of the third embodiment.

In the spring electrode 104 of FIG. 6, the wire conductor 18 is parallel to the normal direction of the opposing surfaces of the lower electrode 16 and the upper electrode 17. However, as in the spring electrode 107 shown in FIG. 9, the wire conductor 18 may be arranged obliquely with respect to the normal direction of the opposing surfaces of the lower electrode 16 and the upper electrode 17. According to such a configuration, as in the case of the spring electrode 103 shown in FIG. 4, the facing area between the front wire conductor 18 and the rear wire conductor 18 is reduced. Accordingly, when the short-circuit current flows, the electromagnetic attractive force acting between the wire conductors 18 is reduced, so that the inward contraction of the spring electrode 104 can be suppressed.

Figure 10:
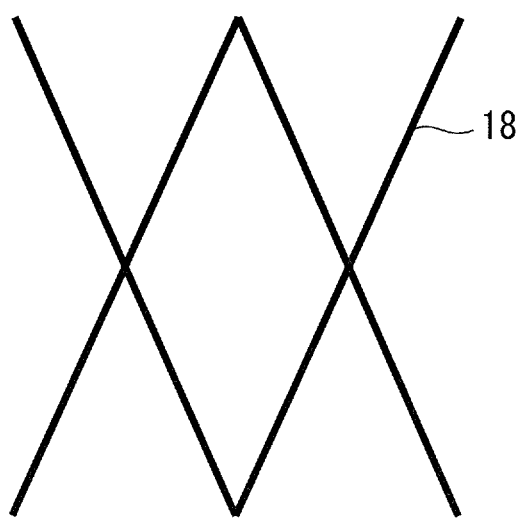
FIG. 10 is a diagram showing a configuration of a spring electrode of a modification of the third embodiment.

Further, as shown in FIG. 10, the wire conductors 18 may be arranged so as to be crossed. Furthermore, the wire conductors 18 shown in FIG. 9 or FIG. 10 may include the bending portions 18a and 18b shown in FIG. 7 or FIG. 8.

<Effect of Third Embodiment>

The spring electrode 104 for a press-pack power semiconductor module of the third embodiment includes: the lower electrode 16 or the upper electrode 17 which is the first electrode in contact with a power semiconductor chip; the lower electrode 16 or the upper electrode 17 which is the second electrode arranged to face the first electrode; and the pressure pad which connects the first electrode and the second electrode and has flexibility in a normal direction of opposing surfaces of the first electrode and the second electrode, in which the pressure pad is a plurality of wire conductors 18 arranged along side surfaces of a virtual cylinder having the first electrode and the second electrode as both end surfaces. Therefore, since the short-circuit current generated when the power semiconductor chip is short-circuited flows while being branched into the plurality of wire conductors 18, the short-circuit current flowing through one wire conductor 18 is reduced. Thereby, the heat generation in each wire conductor 18 and the electromagnetic attractive force between the wire conductors 18 can be reduced. As a result, disconnection of the wire conductors 18 is suppressed, and breakage of the semiconductor module is suppressed.

Further, the plurality of wire conductors 18 may have the bending portions 18a and 18b. In this case, the flexibility of the spring electrode in the vertical direction is increased.

Further, the plurality of wire conductors 18 may be arranged obliquely with respect to the normal direction of the opposing surfaces of the lower electrode 16 and the upper electrode 17. In this case, the facing area between the front wire conductor 18 and the rear wire conductor 18 is reduced. Accordingly, when the short-circuit current flows, the electromagnetic attractive force acting between the wire conductors 18 is reduced, so that the inward contraction of the spring electrode 104 can be suppressed.

If the diameter of the wire conductor 18 is set to 2 mm or more, an effective energization region for a short-circuit current having a frequency of 5 kHz can be secured in the wire conductor 18.

Fourth Embodiment

Figure 11:
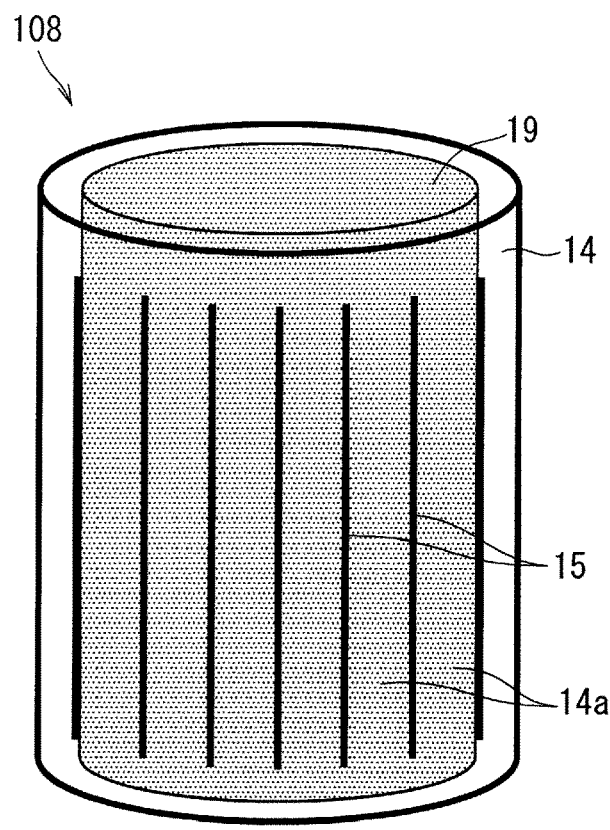
FIG. 11 is a diagram showing a configuration of a spring electrode of a fourth embodiment.

FIG. 11 is a configuration diagram of a spring electrode 108 according to a fourth embodiment. The spring electrode 108 is a spring electrode for a press-pack power semiconductor module, and includes a cylindrical conductor 14 and an internal spring 19. Slits 15 are formed in the cylindrical conductor 14. The internal spring 19 is inserted into the cylindrical conductor 14. That is, the spring electrode 108 is obtained by inserting the internal spring 19 into the internal space surrounded by the lower electrode, the upper electrode, and the cylindrical conductor 14 in the spring electrode 102 of the second embodiment.

The internal spring 19 has a first end and a second end, and is connected to either the upper electrode or the lower electrode at the first end.

By arranging the internal spring 19 in the cylindrical conductor 14, the flexibility of the spring electrode 108 can be enhanced. One or more internal springs 19 may be used. The internal spring 19 may be arranged inside the cylindrical conductor 14 after being put in a cover slightly shorter than the spring length. At this time, it is desirable to use a coil spring for the internal spring 19.

FIG. 11 shows an example in which the internal spring 19 is applied to the spring electrode 102 of the second embodiment. However, the internal spring 19 can be applied to any of the spring electrodes 101, 103, 104, 105, 106, and 107 described so far.

<Effect of Fourth Embodiment>

The spring electrode 108 for a press-pack power semiconductor module according to the fourth embodiment includes the internal spring 19 in addition to the configuration of the spring electrode 102 according to the second embodiment. The internal spring 19 is provided in an internal space surrounded by the upper electrode or the lower electrode that is the first electrode, the upper electrode or the lower electrode that is the second electrode, and the cylindrical conductor 14 that is the pressure pad. The internal spring 19 has the first end and the second end, and is connected to either the upper electrode or the lower electrode at the first end. According to the above configuration, the flexibility of the spring electrode 108 can be enhanced by providing the internal spring 19.

Fifth Embodiment

Figure 12:
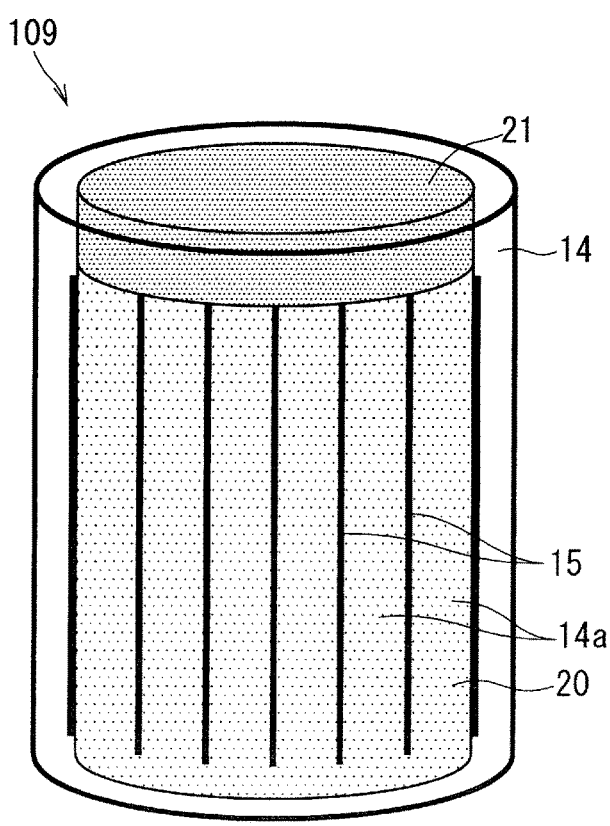
FIG. 12 is a diagram showing a configuration of a spring electrode of a fifth embodiment.

FIG. 12 is a configuration diagram of a spring electrode 109 according to a fifth embodiment. The spring electrode 109 is a spring electrode for a press-pack power semiconductor module, and includes a cylindrical conductor 14, an insulator 20, and an internal spring 21. Slits 15 are formed in the cylindrical conductor 14.

Although not shown in FIG. 12, the upper end of the cylindrical conductor 14 is in contact with an upper electrode, and the lower end is in contact with a lower electrode. The insulator 20 and the internal spring 21 are inserted into the internal space surrounded by the upper electrode, the lower electrode, and the cylindrical conductor 14. That is, the spring electrode 109 is obtained by inserting the insulator 20 in the internal space in addition to the internal spring in the configuration of the spring electrode 108 of the fourth embodiment.

In FIG. 12, the first end of the internal spring 21 is in contact with the upper electrode, and the second end is in contact with the insulator 20. The insulator 20 is provided between the second end of the internal spring 21 and the lower electrode. However, the first end of the internal spring 21 may be in contact with the lower electrode, and the insulator 20 may be provided between the second end of the internal spring 21 and the upper electrode.

The stroke of the internal spring 21 is shorter than the stroke of the internal spring 19 of the fourth embodiment by the amount that the insulator 20 is inserted. Therefore, it is possible to use a disc spring for the internal spring 21.

<Effect of Fifth Embodiment>

The spring electrode 109 for a press-pack power semiconductor module according to the fifth embodiment further includes the insulator 20 provided between the first electrode or the second electrode not connected to the first end of the internal spring 21 and the second end of the internal spring 21 in the internal space surrounded by the upper electrode, the lower electrode, and cylindrical conductor 14. Accordingly, since the stroke of the internal spring 21 is shortened by the amount of the insulator 20, a disc spring can be used.

Sixth Embodiment

Figure 13:
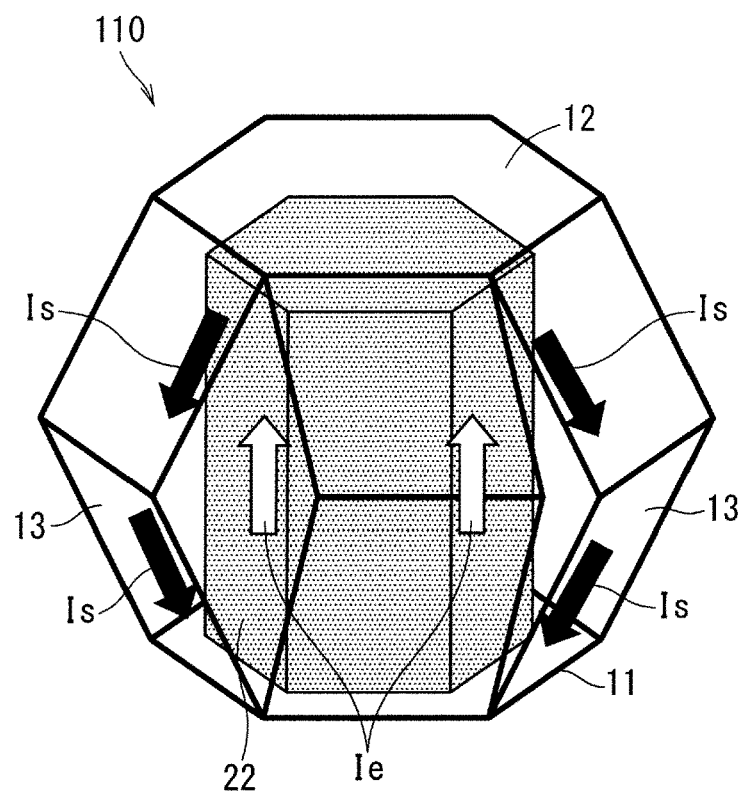
FIG. 13 is a diagram showing a configuration of a spring electrode of a sixth embodiment.

FIG. 13 is a configuration diagram of a spring electrode 110 according to a sixth embodiment. The spring electrode 110 is a spring electrode for a press-pack power semiconductor module, and includes a lower electrode 11, an upper electrode 12, a pressure pad 13, and a conductor block 22.

The spring electrode 110 is obtained by adding the conductor block 22 to the configuration of the spring electrode 101 of the first embodiment. The conductor block 22 is arranged in an internal space surrounded by the lower electrode 11, the upper electrode 12, and the pressure pads 13, and is connected to either the lower electrode 11 or the upper electrode 12.

The conductor block 22 is a hexagonal column that conforms to the shape of the lower electrode 11 and the upper electrode 12. The conductor block 22 is electrically connected to the lower electrode 11 when the lower surface of the conductor block 22 is in contact with the lower electrode 11. On the other hand, since there is a space between the upper surface of the conductor block 22 and the upper electrode 12, the spring electrode 110 can expand and contract in the vertical direction.

In FIG. 13, the lower surface of the conductor block 22 is in contact with the lower electrode 11, but the upper surface may be in contact with the upper electrode 12, and there may be a space between the lower surface and the lower electrode 11.

Since the short-circuit current Is flows through the pressure pads 13 in the same direction (in the direction from the upper electrode 12 to the lower electrode 11 in FIG. 13), an electromagnetic attractive force is generated between the pressure pads 13. If the pressure pads 13, that is, the conductive path is disconnected by this electromagnetic attractive force, and an arc is generated at the disconnected portion, the semiconductor module is broken.

When the short-circuit current Is flows through the pressure pads 13, the eddy current Ie in the direction opposite to the short-circuit current Is flows through the conductor block 22 so as to cancel the magnetic flux due to the short-circuit current Is. Since electromagnetic repulsion is generated between the short-circuit current Is and the eddy current Ie, the above-described electromagnetic attractive force is reduced. Thereby, breakage of the semiconductor module due to disconnection of the pressure pads 13 is suppressed.

Since the short-circuit current Is is a high frequency, the eddy current Ie excited in the conductor block 22 is also a high frequency and flows only on the surface of the conductor block 22. Therefore, the conductor block 22 may be hollow.

<Modification of Sixth Embodiment>

In FIG. 13, a space for the spring electrode 110 to expand and contract in the vertical direction is provided between the upper surface of the conductor block 22 and the upper electrode 12. An internal spring such as a disc spring may be arranged in this space. Thereby, the flexibility of the spring electrode 110 can be enhanced.

<Effect of Sixth Embodiment>

The spring electrode 110 for a press-pack power semiconductor module according to the sixth embodiment includes the conductor block 22 provided in an internal space surrounded by the lower electrode 11, the upper electrode 12, and the pressure pads 13. The conductor block 22 is connected to either the lower electrode 11 or the upper electrode 12 at the first end surface. According to such a configuration, when the short-circuit current flows through the pressure pads 13, the eddy current Ie in the opposite direction flows through the conductor block 22. Therefore, the electromagnetic attractive force generated between the pressure pads 13 due to the short-circuit current can be reduced by the electromagnetic repulsive force due to the eddy current Ie. As a result, breakage of the semiconductor module due to disconnection of the pressure pads 13 is suppressed.

Further, there may be provided the internal spring between the second end surface of the conductor block 22 and the lower electrode 11 or the upper electrode 12 not connected to the first end surface of the conductor block 22 in the internal space surrounded by the lower electrode 11, the upper electrode 12, and the pressure pads 13. Thereby, the flexibility of the spring electrode can be enhanced.

Seventh Embodiment

Figure 14:
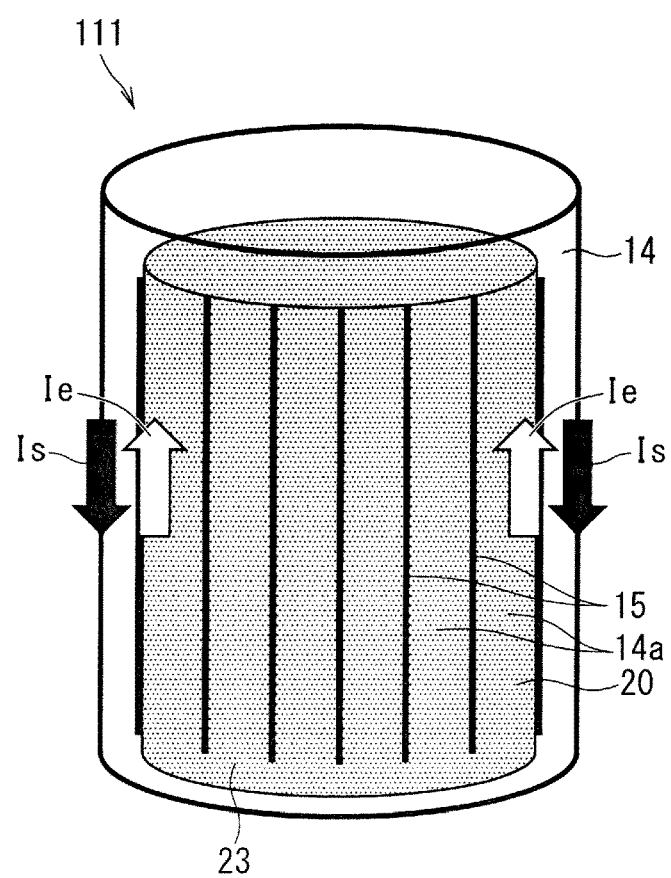
FIG. 14 is a diagram showing a configuration of a spring electrode of a seventh embodiment.

FIG. 14 is a configuration diagram of a spring electrode 111 according to a seventh embodiment. The spring electrode 111 is a spring electrode for a press-pack power semiconductor module, and includes a cylindrical conductor 14 and a cylindrical conductor block 23. Slits 15 are formed in the cylindrical conductor 14. That is, the spring electrode 111 is obtained by adding the conductor block 23 to the configuration of the spring electrode 102 of the second embodiment.

Although not shown in FIG. 14, the upper end of the cylindrical conductor 14 is in contact with the upper electrode, and the lower end of the cylindrical conductor 14 is in contact with the lower electrode. The conductor block 23 is inserted in an internal space surrounded by the lower electrode, the upper electrode, and the cylindrical conductor 14. By connecting the bottom surface, which is the first end surface of the conductor block 23, to the lower electrode, the conductor block 23 is electrically connected to the lower electrode. On the other hand, there is a space between the upper surface, which is the second end surface of the conductor block 23, and the upper electrode, and the spring electrode 111 can expand and contract in the vertical direction by this space.

In FIG. 14, the lower surface of the conductor block 23 is connected to the lower electrode, but the upper surface of the conductor block 23 may be connected to the upper electrode. In this case, there is a space between the lower surface of the conductor block 23 and the lower electrode, and the spring electrode 111 can expand and contract in the vertical direction by this space.

Since the short-circuit current Is flows in the same direction (in the direction from the upper electrode to the lower electrode in FIG. 14) in each divided region 14a of the cylindrical conductor 14 by the slit 15, an electromagnetic attractive force is generated between the pressure pads 13. If the pressure pads 13, that is, the conductive path is disconnected by this electromagnetic attractive force, and an arc is generated at the disconnected portion, the semiconductor module is broken.

When the short-circuit current Is flows through each divided region 14a, the eddy current Ie in the direction opposite to the short-circuit current Is flows through the conductor block 23 so as to cancel the magnetic flux due to the short-circuit current Is. Since electromagnetic repulsion is generated between the short-circuit current Is and the eddy current Ie, the above-described electromagnetic attractive force is reduced. Thereby, the breakage of the semiconductor module due to the disconnection of the divided regions 14a is suppressed.

Since the short-circuit current Is is a high frequency, the eddy current Ie excited in the conductor block 23 is also a high frequency and flows only on the surface of the conductor block 23. Therefore, the conductor block 23 may be hollow.

<Modification of Seventh Embodiment>

Figure 15:
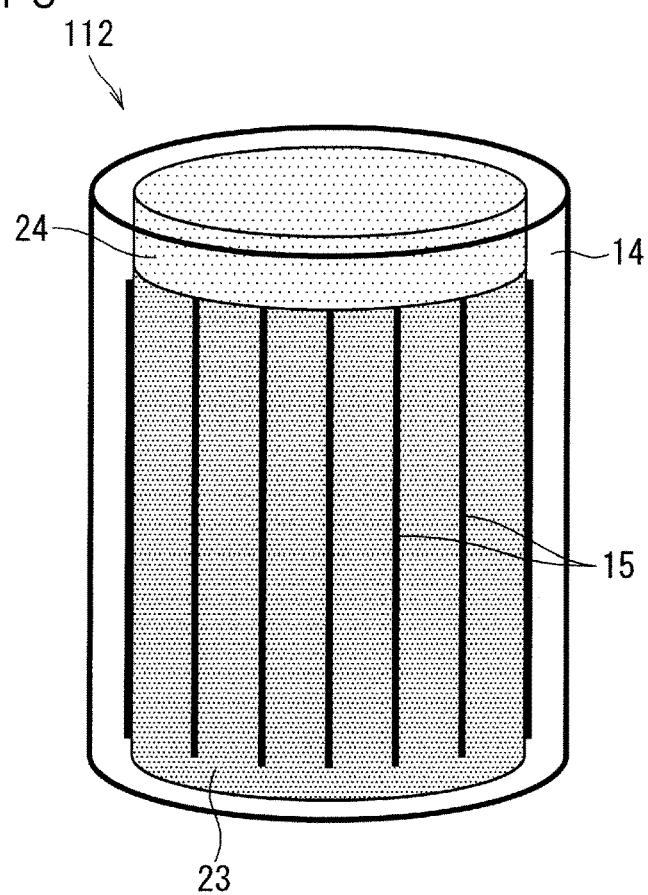
FIG. 15 is a diagram showing a configuration of a spring electrode of a modification of the seventh embodiment.

In FIG. 14, a space for the spring electrode 111 to expand and contract in the vertical direction is provided between the upper surface of the conductor block 23 and the upper electrode. Like the spring electrode 112 shown in FIG. 15, an internal spring 24 may be arranged in this space. As the internal spring 24, for example, a disc spring can be used. Thereby, the flexibility of the spring electrode 112 can be enhanced.

<Effect of Seventh Embodiment>

The spring electrode 111 for a press-pack power semiconductor module according to the seventh embodiment includes the conductor block 23 provided in an internal space surrounded by the lower electrode, the upper electrode, and the cylindrical conductor 14. The conductor block 23 is connected to either the lower electrode or the upper electrode at the first end surface. According to such a configuration, when the short-circuit current flows through each divided region 14a of the cylindrical conductor 14, the eddy current Ie in the opposite direction flows through the conductor block 23. Therefore, the electromagnetic attractive force generated between the divided regions 14a due to the short-circuit current can be reduced by the electromagnetic repulsive force due to the eddy current Ie. As a result, the breakage of the semiconductor module due to the disconnection of the divided regions 14a is suppressed.

Further, there may be provided the internal spring 24 between the second end surface of the conductor block 23 and the lower electrode 11 or the upper electrode 12 not connected to the first end surface of the conductor block 23 in the internal space surrounded by the lower electrode, the upper electrode, and the cylindrical conductor 14. Thereby, the flexibility of the spring electrode can be enhanced.

Eighth Embodiment

Figure 16:
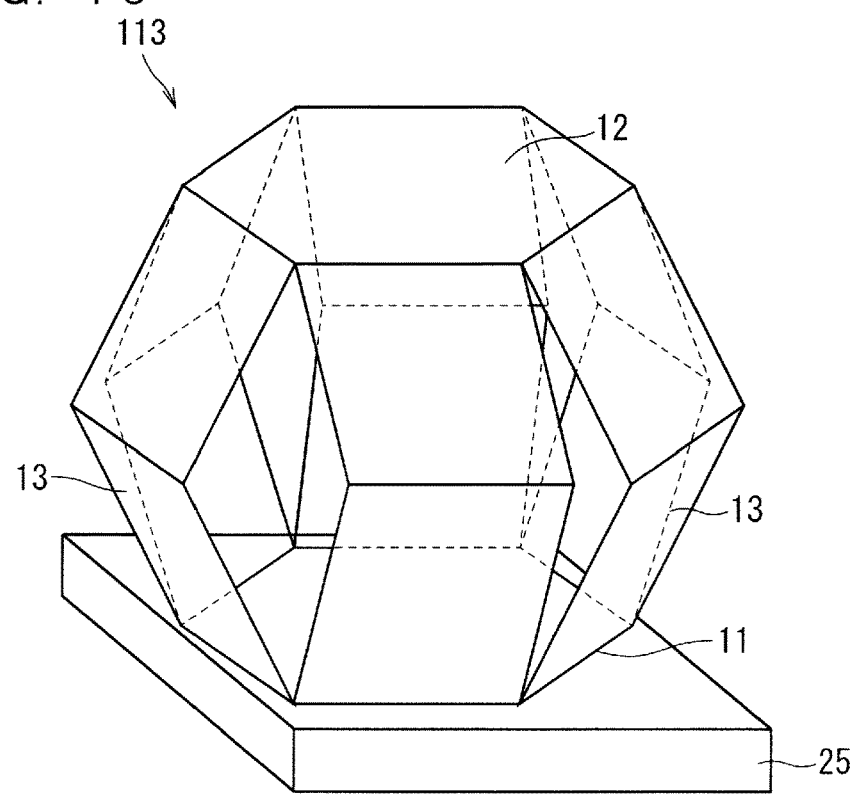
FIG. 16 is a diagram showing a configuration of a spring electrode of an eighth embodiment.

FIG. 16 is a configuration diagram of a spring electrode 113 according to an eighth embodiment. The spring electrode 113 is a spring electrode for a press-pack power semiconductor module, and includes a lower electrode 11, an upper electrode 12, pressure pads 13, and a lower electrode 25. That is, the spring electrode 113 has a configuration in which the lower electrode 25 is provided on the spring electrode 101 according to the first embodiment.

The lower electrode 25 is bonded to the lower surface of the lower electrode 11. The bottom surface of the lower electrode 25 is a square and serves as a bonding surface with a power semiconductor chip (not shown). The bonded body of the lower electrode 25 and the lower electrode 11 functions as the first electrode.

Since the bottom surface of the lower electrode 25 is a square, it is possible to easily bond the lower electrode 25 to a power semiconductor chip having a same square main surface.

The size of the lower surface of the lower electrode 25 is set to the same size as the main surface of the power semiconductor chip, or a size obtained by adding a predetermined margin to the size of the main surface of the power semiconductor chip. Thereby, the size of the spring electrode 113 can be minimized, and the space in the power semiconductor module can be efficiently used.

<Effect of Eighth Embodiment>

In the spring electrode 113 for a press-pack power semiconductor module according to the eighth embodiment, the contact surface of the lower electrode 25 which is the first electrode with the power semiconductor chip is a square. Accordingly, it is possible to easily bond the power semiconductor chip having the same square main surface.

It should be noted that, in the present invention, the embodiments can be freely combined with each other within the scope of the invention, and each embodiment can be appropriately modified or omitted.

Although the present invention has been described in detail, the above description is an exemplification in all aspects, and the present invention is not limited thereto. It is understood that countless variations not illustrated are conceivable without departing from the scope of the present invention.

EXPLANATION OF REFERENCE SIGNS 11, 16, 25: lower electrode
12, 17: upper electrode
13: pressure pad
14: cylindrical conductor
14a: divided region
15: slit
18: wire conductor
18a, 18b: bending portion
19, 21, 24: internal spring
20: insulator
22, 23: conductor block 101, 102, 103, 104, 105, 106, 107, 108, 109, 110, 111, 112, 113: spring electrode

The invention claimed is:

1. A spring electrode for a press-pack power semiconductor module, comprising:
    a first electrode in contact with a power semiconductor chip;
    a second electrode arranged to face the first electrode; and
    a pressure pad which connects the first electrode and the second electrode and has flexibility in a normal direction of opposing surfaces of the first electrode and the second electrode,
    wherein the opposing surfaces of the first electrode and the second electrode are polygons of a pentagon or more, and
    wherein sides of the opposing surface of the first electrode and sides of the opposing surface of the second electrode corresponding to these sides are connected in parallel by the pressure pad.

2. The spring electrode for a press-pack power semiconductor module according to claim 1, wherein the opposing surfaces of the first electrode and the second electrode are regular polygons.

3. A spring electrode for a press-pack power semiconductor module, comprising:
    a first electrode in contact with a power semiconductor chip;
    a second electrode arranged to face the first electrode; and
    a pressure pad which connects the first electrode and the second electrode and has flexibility in a normal direction of opposing surfaces of the first electrode and the second electrode,
    wherein each end of the pressure pad is connected only to respective peripheral portions of the first electrode and the second electrode to define a hollow cylindrical internal space bounded by a cylindrical conductor having a cylindrical axis in the normal direction of the opposing surfaces of the first electrode and the second electrode, and
    the cylindrical conductor includes a plurality of slits extending from a side of the first electrode to a side of the second electrode except for both ends thereof.

4. The spring electrode for a press-pack power semiconductor module according to claim 3, wherein the plurality of slits are formed at equal intervals in a circumferential direction of the cylindrical conductor.

5. The spring electrode for a press-pack power semiconductor module according to claim 3, wherein the plurality of slits are formed obliquely with respect to a cylindrical axis direction of the cylindrical conductor.

6. A spring electrode for a press-pack power semiconductor module, comprising:
    a first electrode in contact with a power semiconductor chip;
    a second electrode arranged to face the first electrode; and
    a pressure pad which connects the first electrode and the second electrode and has flexibility in a normal direction of opposing surfaces of the first electrode and the second electrode,
    wherein the pressure pad is a plurality of wire conductors arranged along side surfaces of a virtual cylinder having the first electrode and the second electrode as both end surfaces, each space between adjacent ones of the wire conductors being wider than each of the wire conductors.

7. The spring electrode for a press-pack power semiconductor module according to claim 6, wherein the plurality of wire conductors have a bending portion.

8. The spring electrode for a press-pack power semiconductor module according to claim 6, wherein the plurality of wire conductors are arranged obliquely with respect to the normal direction of the opposing surfaces of the first electrode and the second electrode.

9. The spring electrode for a press-pack power semiconductor module according to claim 6, wherein the plurality of wire conductors have a diameter of 2 mm or more.

10. The spring electrode for a press-pack power semiconductor module according to claim 1, further comprising an internal spring provided in an internal space surrounded by the first electrode, the second electrode, and the pressure pad,
    wherein the internal spring has a first end and a second end, and is connected to either the first electrode or the second electrode at the first end.

11. The spring electrode for a press-pack power semiconductor module according to claim 10, further comprising an insulator provided between one of the first electrode or the second electrode that is not connected to the first end of the internal spring and the second end of the internal spring in the internal space.

12. The spring electrode for a press-pack power semiconductor module according to claim 1, further comprising a conductor block provided in an internal space surrounded by the first electrode, the second electrode, and the pressure pad,
    wherein the conductor block has a first end and a second end, and is connected to either the first electrode or the second electrode at the first end.

13. The spring electrode for a press-pack power semiconductor module according to claim 12, further comprising an internal spring provided between the second end of the conductor block and the first electrode or the second electrode not connected to the first end of the conductor block in the internal space.

14. The spring electrode for a press-pack power semiconductor module according to claim 1, wherein a contact surface of the first electrode with the power semiconductor chip is a square.

15. The spring electrode for a press-pack power semiconductor module according to claim 3, further comprising an internal spring provided in the internal space,
    wherein the internal spring has a first end and a second end, and is connected to either the first electrode or the second electrode at the first end.

16. The spring electrode for a press-pack power semiconductor module according to claim 15, further comprising an insulator provided between one of the first electrode or the second electrode that is not connected to the first end of the internal spring and the second end of the internal spring in the internal space.

17. The spring electrode for a press-pack power semiconductor module according to claim 3, further comprising a conductor block provided in the internal space,
    wherein the conductor block has a first end and a second end, and is connected to either the first electrode or the second electrode at the first end.

18. The spring electrode for a press-pack power semiconductor module according to claim 17, further comprising an internal spring provided between the second end of the conductor block and the first electrode or the second electrode not connected to the first end of the conductor block in the internal space.

19. The spring electrode for a press-pack power semiconductor module according to claim 6, further comprising an internal spring provided in an internal space surrounded by the first electrode, the second electrode, and the pressure pad, wherein the internal spring has a first end and a second end, and is connected to either the first electrode or the second electrode at the first end.

20. The spring electrode for a press-pack power semiconductor module according to claim 6, wherein each of the plurality of wire conductors has a circular cross section.

* * * * *